US009059728B2

(12) United States Patent
Chambliss et al.

(10) Patent No.: US 9,059,728 B2
(45) Date of Patent: *Jun. 16, 2015

(54) RANDOM EXTRACTION FROM COMPRESSED DATA

(71) Applicant: International Business Machines Corporation, Armonk, NY (US)

(72) Inventors: David D. Chambliss, Morgan Hill, CA (US); Mihail C. Constantinescu, San Jose, CA (US); Joseph S. Glider, Palo Alto, CA (US); Dilip N. Simha, Medfield, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/015,228

(22) Filed: Aug. 30, 2013

(65) Prior Publication Data

US 2014/0333457 A1    Nov. 13, 2014

Related U.S. Application Data

(63) Continuation of application No. 13/891,241, filed on May 10, 2013, now Pat. No. 8,823,557.

(51) Int. Cl.
*H03M 7/30*         (2006.01)

(52) U.S. Cl.
CPC .......... *H03M 7/3084* (2013.01); *H03M 7/6005* (2013.01)

(58) Field of Classification Search
CPC .... H03K 19/173; H03M 7/14; H03M 7/3084; G06F 2212/401; G06F 13/89; G06F 17/30

USPC ......................................... 341/50, 51, 65, 67
See application file for complete search history.

(56) References Cited

U.S. PATENT DOCUMENTS

| | | |
|---|---|---|
| 5,058,144 A | 10/1991 | Fiala et al. |
| 5,532,694 A | 7/1996 | Mayers et al. |
| 5,572,206 A | 11/1996 | Miller et al. |
| 6,643,329 B1 | 11/2003 | Wu et al. |
| 6,819,271 B2 | 11/2004 | Geiger et al. |
| 6,876,774 B2 | 4/2005 | Satoh et al. |
| 7,129,860 B2 | 10/2006 | Alvarez, II et al. |
| 8,004,431 B2 | 8/2011 | Reznik |
| 8,456,331 B2 | 6/2013 | Carlson |

OTHER PUBLICATIONS

Hintz et al., Design of an Incremental Compiler and Interactive Interpreter Utilizing a Hybrid Token-Threaded Code, IP.com, Mar. 1, 1984.
Lee et al., Token-Ring Reservation Enhancer for Early Token Release, IBM Technical Disclosure Bulletin, vol. 33, No. 7, Dec. 1990.
Cheng et al., Effective INTER-Parallel Schemes for Compression/Decompression Speed-Up, IBM Technical Disclosure Bulletin, vol. 40, No. 4, Apr. 1997.

*Primary Examiner* — Peguy Jean Pierre
(74) *Attorney, Agent, or Firm* — Lieberman & Brandsdorfer, LLC

(57) ABSTRACT

Aspects of the invention are provided for decoding a selected span of data within a compressed code stream. A selection of data within the compressed code stream from an arbitrary position is presented for decompression. The arbitrary position is the starting point in the compressed code stream for decompression, and a phrase within the compressed code stream containing the starting point is identified. From the arbitrary starting point, a back pointer may provide direction to the literal. The literal is extracted as a decoding of the compressed data associated with the starting point.

16 Claims, 7 Drawing Sheets

RANDOM EXTRACTION FROM COMPRESSED DATA

CROSS REFERENCE TO RELATED APPLICATION(S)

This application is a continuation patent application claiming the benefit of the filing date of U.S. patent application Ser. No. 13/891,241 filed on May 10, 2013 and titled "Random Extraction From Compressed Data," now pending, which is hereby incorporated by reference.

BACKGROUND

The present invention relates to extracting data from compressed data. More specifically, the invention relates to data decompression for a random location within a compressed data block.

Data compression is the process of transforming information from a first representation to a second representation, with the second representation being smaller than the first representation (also known as the original representation). Compressed data may be decompressed from which the original, or a close approximation to it, can be recovered. Compression and decompression processes are often referred to as encoding and decoding. Data compression has important applications in the areas of data storage and data transmission. Besides space savings, other parameters of concern include encoding and decoding speeds and workspace requirements, the ability to access and decode partial files, and error generation and propagation.

The data compression process is said to be lossless if the recovered data are assured to be identical to the source; otherwise the compression process is said to be lossy. Lossless compression techniques are required for applications involving textual data. Other applications, such as those involving voice and image data, may be sufficiently flexible to allow controlled degradation in the data.

BRIEF SUMMARY

This invention comprises a method for randomly extracting files or blocks from a compressed code stream.

A method is provided for decompressing a portion of a compressed code stream, by first pre-processing the code stream and creating a phrase array for representation of the compressed code stream. The phrase array includes at least one literal. The compressed code stream is then decoded from an arbitrary position, using the phrase array. Based on characteristics associated with the position, a directing the decoding process to the underlying literal, which is extracted from the code stream as the decompressed data.

Other features and advantages of this invention will become apparent from the following detailed description of the presently preferred embodiment of the invention, taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments of the invention, and not of all embodiments of the invention unless otherwise explicitly indicated.

DETAILED DESCRIPTION

It will be readily understood that the components of the present invention, as generally described and illustrated in the Figures herein, may be arranged and designed in a wide variety of different configurations. Thus, the following detailed description of the embodiments of the apparatus, system, and method of the present invention, as presented in the Figures, is not intended to limit the scope of the invention, as claimed, but is merely representative of selected embodiments of the invention.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily referring to the same embodiment.

The illustrated embodiments of the invention will be best understood by reference to the drawings, wherein like parts are designated by like numerals throughout. The following description is intended only by way of example, and simply illustrates certain selected embodiments of devices, systems, and processes that are consistent with the invention as claimed herein.

There are different forms of data compression for a code stream. LZ77 pertains to a data compression algorithm that builds a dictionary of frequently repeated groups of bit patterns on a per-file basis and represents these frequent patterns as shorter bit patterns using metadata in the form of a phrase array, also referred to herein as a dictionary. The following figures and associated description pertain to decompressing a code stream that was compressed using the LZ77 compression algorithm, or an equivalent thereof.

A code stream compressed with the LZ77 algorithm has all the information needed to extract data starting from any byte position within the code stream. More specifically, the code stream is compressed into a sequence of phrases, with each phrase parsing corresponding to a token in the code stream either in the form of a literal or a tuple representing a match. The tuple includes at least two values, including a back pointer to a location within a previously encoded phrase, and a length of the phrase. Accordingly, each phrase is or ultimately references an associated literal within the compressed stream.

Figure 1:
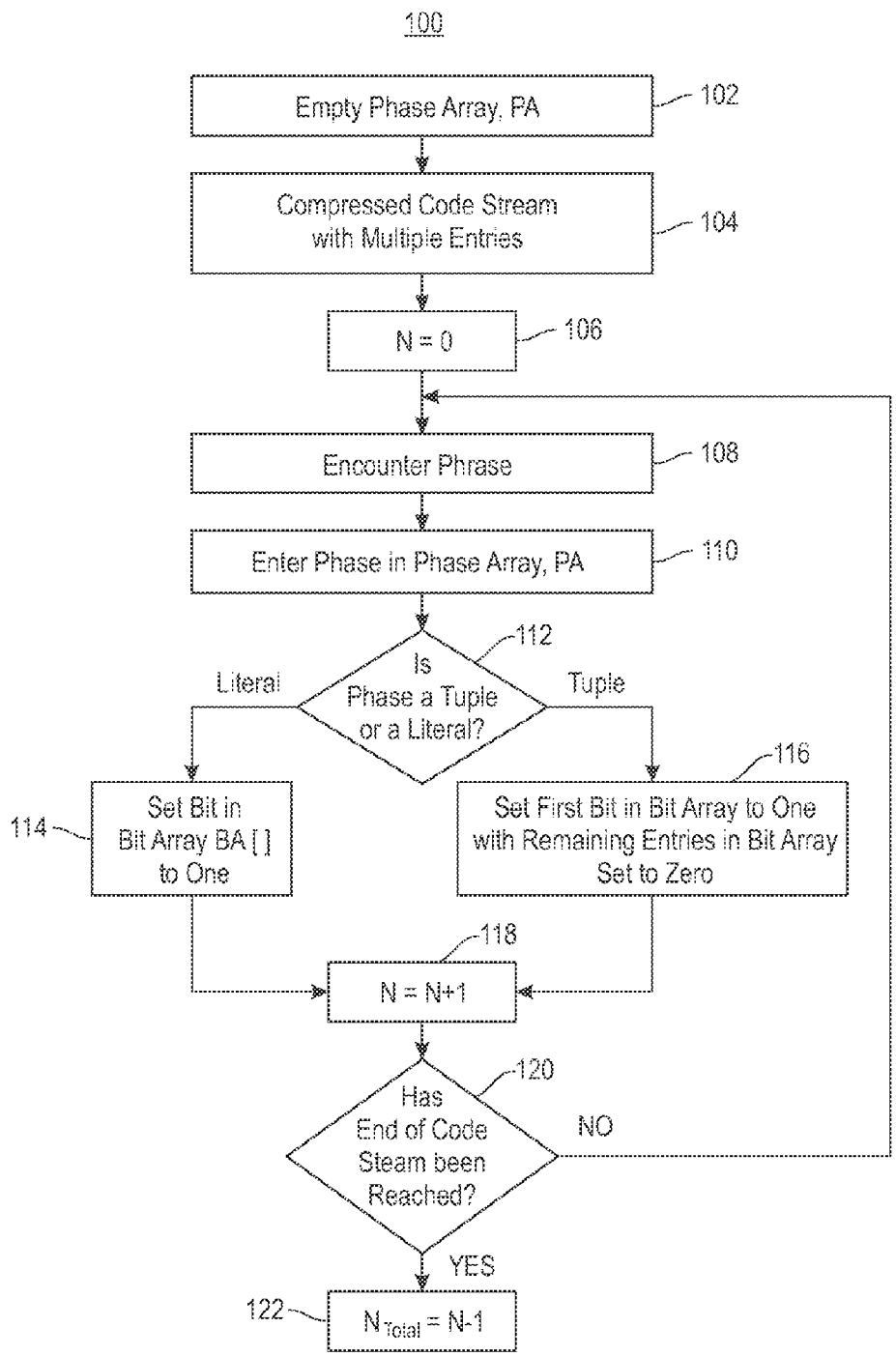
FIG. 1 depicts a flow chart illustrating pre-processing of a compressed code stream to create a phrase array representation of the compressed code stream.

FIG. 1 is a flow chart (100) illustrating a pre-processing of a compressed code stream to create a phrase array representation of the compressed code stream, together with creating a bit array to map from a byte domain to the phrases. The compressed code stream consists of tokens in the form of literals or tuples of back pointer and length. The size of the phrase array is directly related to the number of entries, e.g. the number of tokens discovered when pre-processing the code stream. The phrase array PA[ ] is initially empty (102). A compressed code stream contains multiple entries, each entry in the form of either a literal or a tuple (104). A counting variable N is initially set to zero (106). As a phrase$_N$ is encountered (108), it is recorded in the phrase array, PA (110). In addition, it is determined if phrase$_N$ is a tuple or a literal (112). If phrase$_N$ is a literal, a bit in a bit array BA[ ] is set to one (114), and if phrase$_N$ is a tuple, the first bit representing phrase$_N$ in the bit array is set to one, with the remaining entries in the bit array set to zero (116). Following entry in the bit array, the counting variable N is incremented (118), and it is determined if the end of the code stream has been reached (120). A negative response to the determination is followed by a return to step (108), and a positive response is followed by assigning the number of discovered phrases and entries in the phrase array PA[ ] while scanning the code stream, N−1 to N$_{Total}$ (122). Accordingly, the phrase array is an indexing or enumeration of the tokens discovered while pre-processing the code stream.

As shown in FIG. 1, a bit array, BA [ ], was created during the pre-processing of the code stream. During decoding, the bit array can be used to find what phrase a given byte belongs to by counting how many 1's are in the bit array before the byte address. For example, J can represent the phrase of a byte address, e.g. J=phraseOf[byte_address_a], meaning that phrase J contains the byte with address byte_address_a. The same bit array can be used as well to map from phrases to the bytes where the phrase starts. For example start_byte=startOf (J) will give the address of the first byte in phrase J. Accordingly, the pre-processing of the code stream as demonstrated in FIG. 1 enables selective decoding of a relevant phrase.

FIG. 1 illustrates pre-processing of a compressed code stream and creation of a phrase array for the compressed code stream. In one embodiment, the compressed code stream is divided into two or more partitions, with pre-processing separately applied to each partition with each partition having a separate phrase array. Accordingly, decompression of the code stream may be independently decoded with a separate phrase array for each partition.

The process illustrated in FIG. 1 is a pre-processing of a compressed code stream that builds a phrase array representing tokens from the code stream. A token is either a literal or a tuple. Each phrase is identified by a byte address in the code stream and in the compressed code stream. As shown in FIG. 1, the pre-processing of the compressed code stream incorporates creation of the bit array to support mapping of the code stream from a byte domain to a phrase domain and from a phrase domain to a byte domain. A random byte position may be presented to the compressed code stream to find data in a phrase referenced by the address of the byte, or a phrase may be presented to the code stream, since each phrase includes an address and phrase length. Details of the random data input to the phrase are shown and described in detail in FIG. 2.

Based on the pre-processing of the code stream, one or more sequence of bytes may be reconstructed, e.g. decoded.

Figure 2:
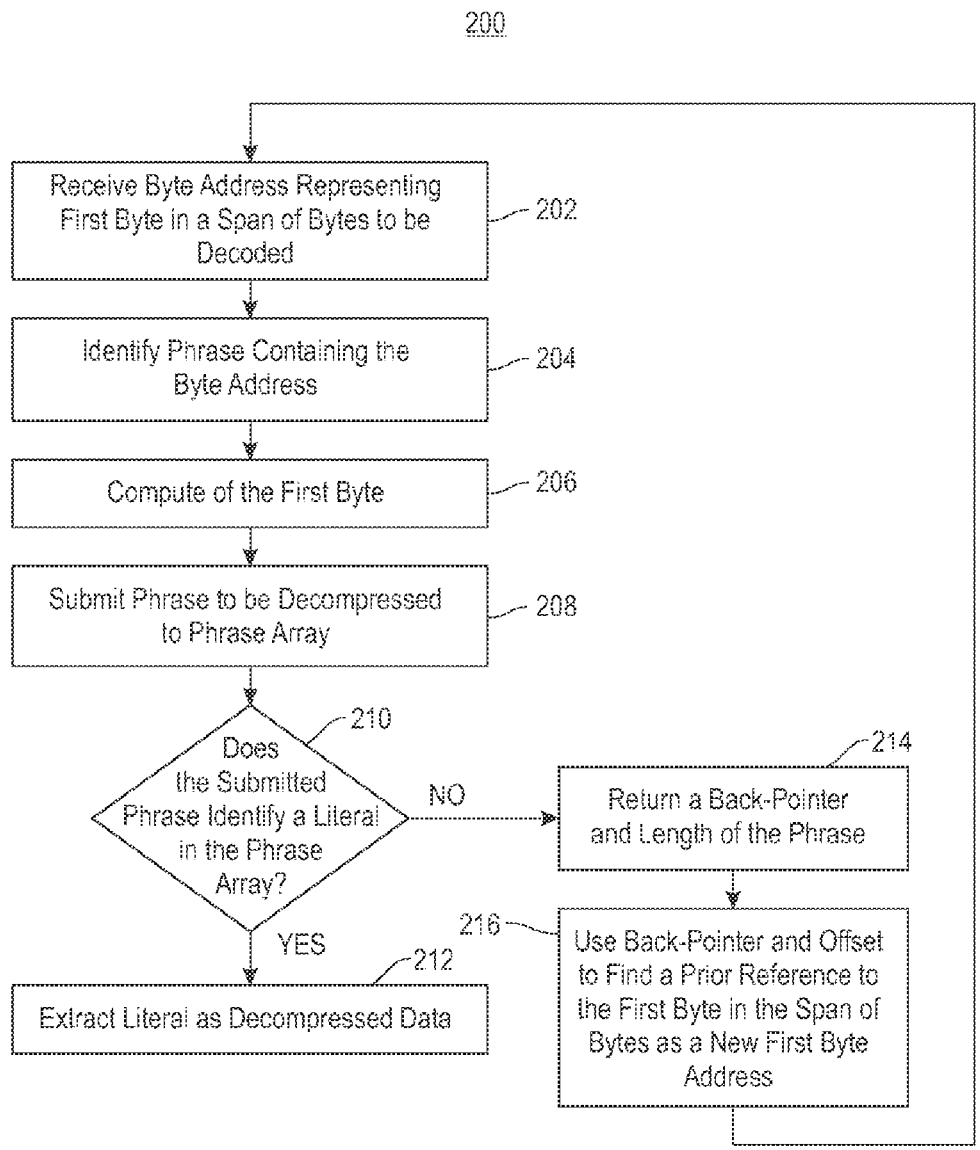
FIG. 2 depicts a flow chart illustrating a recursive extraction algorithm to decode a compressed code stream, or a randomly selected portion of the compressed code stream, from an arbitrary starting point.

As shown and described in FIG. 2 below, the decoding of the compressed code stream is a recursive process from any arbitrary starting point within the compressed code stream. FIG. 2 is a flow chart (200) illustrating a recursive extraction algorithm to decode a compressed code stream, or a randomly selected portion of the compressed code stream, from an arbitrary starting point. A byte address "first_byte_addr", representing the first byte in a span of bytes to be decoded is received (202). In the first step in FIG. 2, the phrase containing this byte address is identified by applying the mapping from byte domain to the phrases, J=phraseOf(first_byte_addr) (204). The offset of the first_byte_addr in phrase J is also computed (206), offset=first_byte_addr−startOf(J). The phrase J to be decompressed is submitted to the phrase array (208). It is determined if the submitted phrase, phrase J, identifies a literal in the phrase array (210). A positive response to the determination at step (210) is followed by extraction of the literal as decompressed data referenced by the random byte address (212). However, a negative response to the determination at step (210) means that phrase J is a tuple containing a back_pointer and a length and returns a back-pointer and a length of the phrase (214). Until the underlying literal of the phrase is found, the phrase referenced by the random byte address is compressed data.

The back pointer for the phrase and the computed offset are employed to find a prior reference to the first byte in the desired span of bytes as new_first_byte_addr=back_pointer+offset (216). With this new first_byte_address, the algorithm is repeated from the first step (202) until the phrase J=phraseOf(first_byte_addr) (202) identifies a literal. Accordingly, the process of decoding from an arbitrary byte address includes recursively traversing the phrase array until the underlying literal is ascertained.

As shown in FIG. 2, a random byte address may be submitted to the phrase array to decompress a specific aspect within the compressed code stream without decompressing the entirety of the code stream. The random byte address may reference a plurality of bytes referred to as a phrase. Submission of the phrase for decoding may return a second phrase or a sequence of phrases starting with the second phrase. In one embodiment, the returned second phrase would include a back pointer directed to a byte address within the second phrase within the phrase array. The literal may be decoded from the second phrase, or in one embodiment, the second phrase may include a back pointer to a third phrase, and the process of ascertaining the literal continues.

Figure 3:
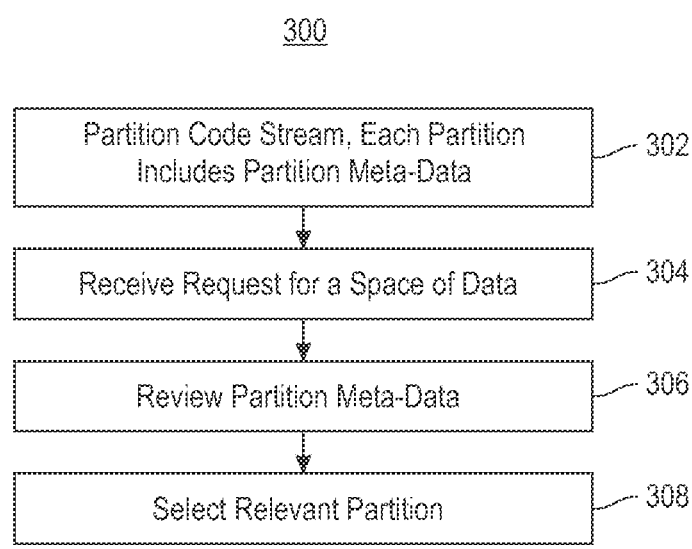
FIG. 3 depicts a flow chart illustrating random decompression of a span of data within the compressed code stream in view of the partitions.

As described above, the code stream may be separated into two or more partitions, with each partition having a separate encoded phrase array. With respect to the random decompression shown in FIG. 2, each of the partitions may be independently decompressed. FIG. 3 is a flow chart (300) illustrating the random decompression of a span of data within the compressed code stream in view of the partitions. Each of the partitions includes partition metadata (302). In one embodiment, the partition metadata includes the partition size and the start address in the code stream of each partition. Following receipt of a request for a span of data to be decompressed (304), the partition metadata is reviewed (306) and the relevant partition for extracting the desired phrase is selected (308). Once the relevant partition is extracted, the decompression of the span of data within the partition follows the logic described in detail in FIG. 2. Accordingly, the random decompression identifies the relevant partition(s).

With respect to the partitions, they may be sequentially decompressed or partially decompressed. A sequential decompression sequentially decompresses the entirety of all the necessary partitions that at least partially contain the requested raw data. In one embodiment, the last partition will be decoded only to the last byte of the requested data rather than the end of the partition. With the partial decompression, the ending portion of the first partition, starting with the first requested byte in the requested data, is partially decompressed and any remaining partitions are sequentially decompressed until the final byte address of the requested data.

Figure 4:
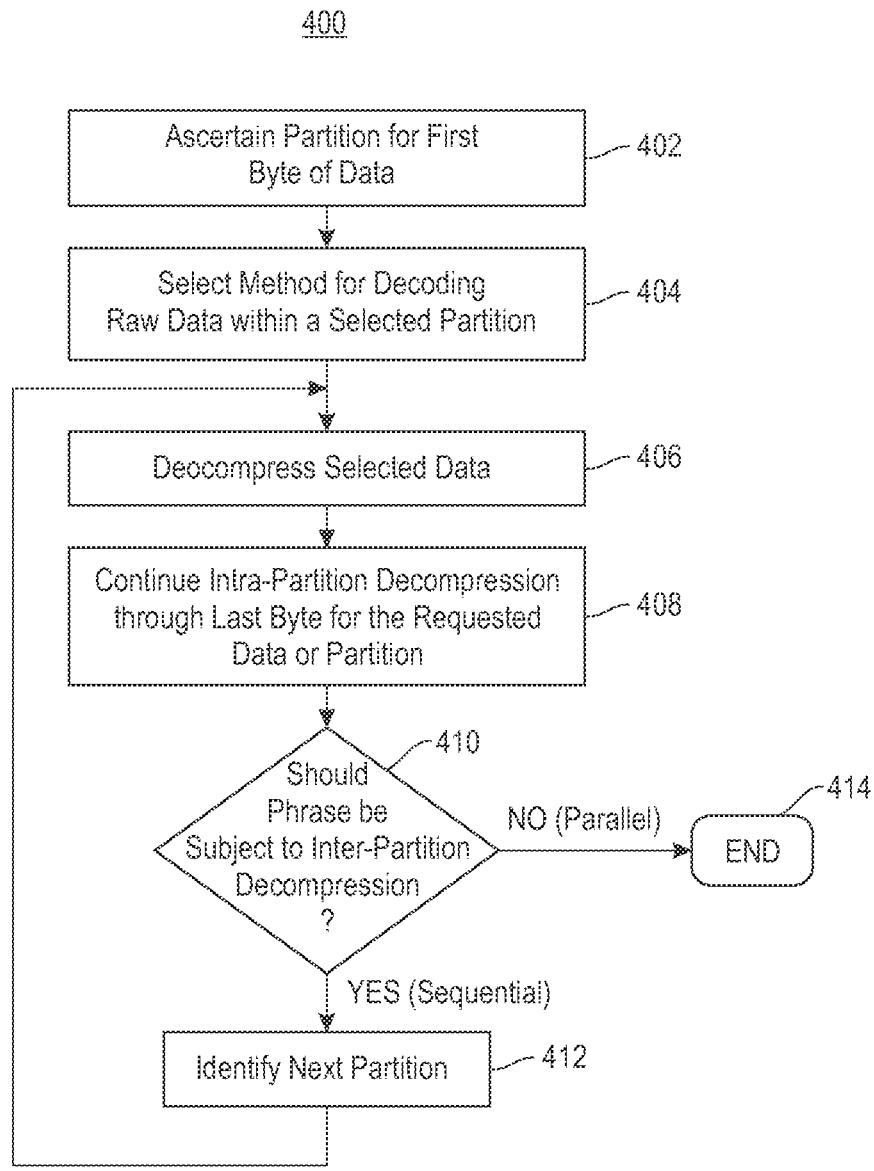
FIG. 4 depicts a flow chart illustrating random decompression of a select span of data based on the partitioning of the compressed code stream.

FIG. 4 is a flow chart (400) illustrating the random decompression of a select span of data based on the partitioning of the compressed code stream. Following a request for the data, the partition in which the requested first byte of the data is ascertained (402). In one embodiment, the aspect of finding the phrase is based upon the partition metadata associated with each of the partitions. A method for decoding the raw data within the compressed partition is selected (404). As described above, the partition may be sequentially decompressed or partially decompressed. Based upon the selected decoding process, the selected data is decompressed for the identified partition (406) and intra-partition decompression continues until either the last byte of the requested data has been decoded or the last byte of the partition has been decoded (408). Following step (408), it is determined if another partition should be utilized for the decompression, i.e. inter-partition decompression, (410). If the decoding process is sequential, the next partition determined to reference the data is identified (412) and the decompression process returns to step (406). However, if the decoding process is partial and the requested data has been decoded, the decompression processes is concluded (414). Accordingly, partitions within the code stream enhance efficiency of decompression.

Figure 5:
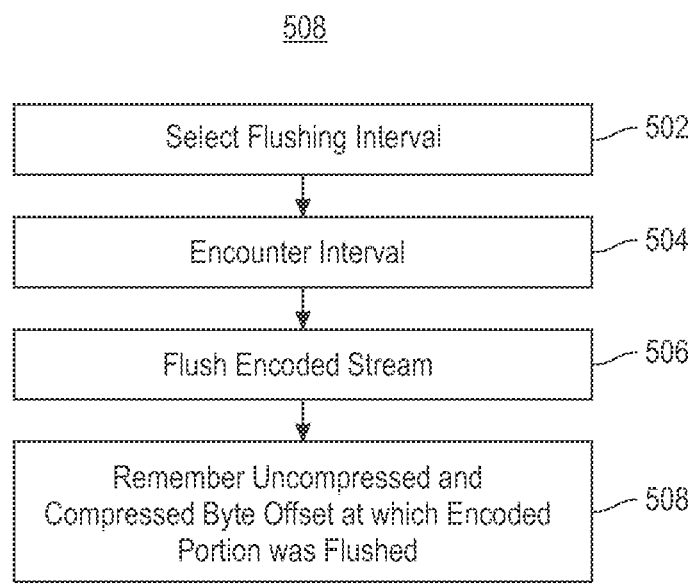
FIG. 5 depicts a flow chart illustrating a process for flushing the encoded stream.

As explained above, the code stream may be dynamic and continue to grow. To accommodate the growth, an associated encoder of the code stream may periodically flush the encoded stream to create partitions of compressed data. FIG. 5 is a flow chart (500) illustrating a process for flushing the encoded stream. An interval for flushing the encoded stream is selected (502). The interval may be periodic, per I/O, or per set of I/Os. As the interval is encountered (504), the encoded stream is flushed (506). At the same time, the uncompressed and compressed byte offset in the stream at which the encoded portion was flushed is remembered (508). Accordingly, the flushing demonstrated herein improves random extraction times of data without negatively influencing a sequential decompression of the entire code stream or an entire partition of the code stream due to the reduction in the quantity of back references.

In one embodiment, the separation of the code stream into partitions increases the metadata needed to track the increased number of objects, with the partition being a class within the object. At the same time, extracting a sequence of partitions is faster and more efficient that extraction of a corresponding set of objects.

Figure 6:
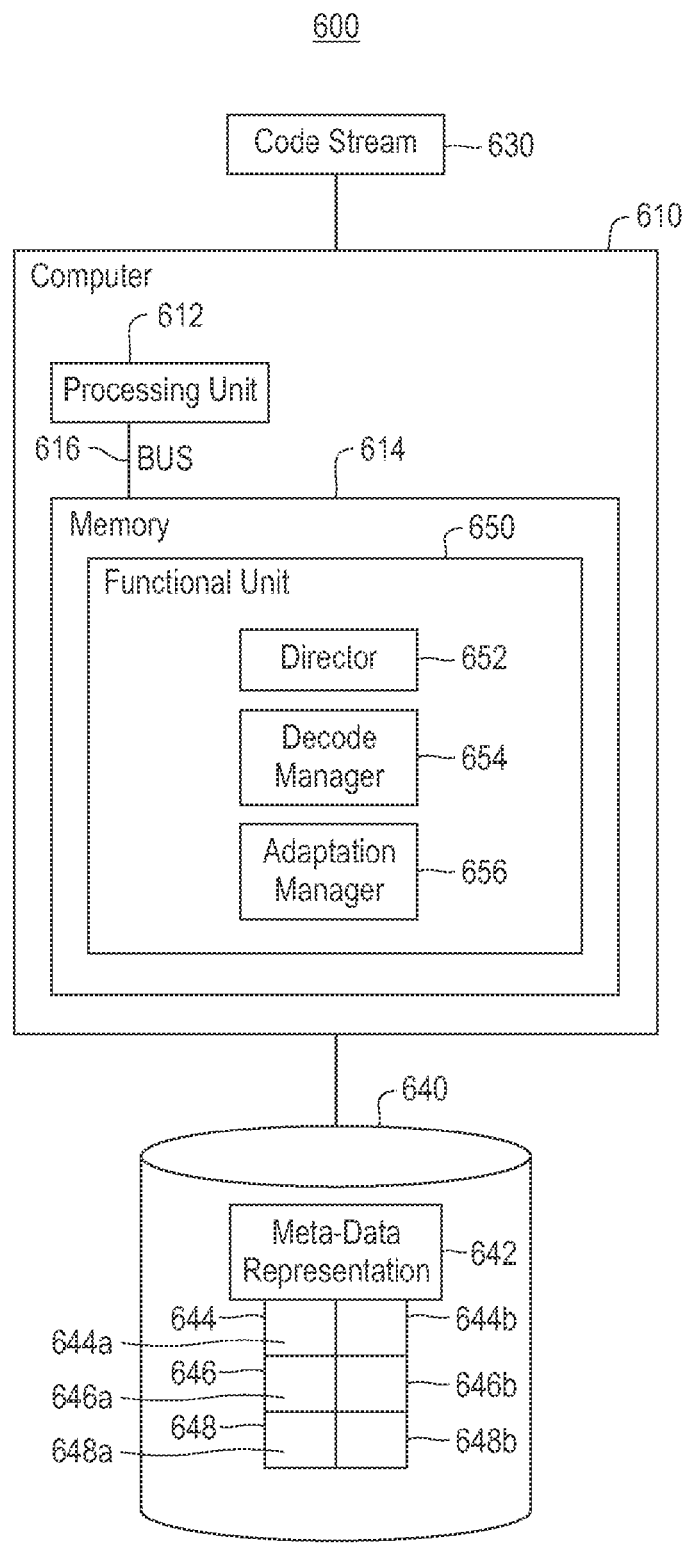
FIG. 6 depicts a block diagram illustrating tools embedded in a computer system to support random extraction of a phrase or segment from compressed data.

The processes shown in FIGS. 1-5 may be embodied as hardware components. FIG. 6 is a block diagram (600) illustrating tools embedded in a computer system to support random extraction of a phrase or segment from compressed data. As shown, the system includes a computer (610) to receive a stream of data (630), also referred to herein as a code stream. The computer (610) is provided with a processing unit (612) in communication with memory (614) across a bus (616). Data storage (640) is provided in local communication with the computer (610) to store received or generated data. In one embodiment the data storage may be remote with access to the storage provided through network communication.

The computer (610) includes a functional unit (650) having one or more tools to support random decompression of data within an encoded data stream. The tools embedded in the functional unit (650) include, but are not limited to, a director (652), a decode manager (654), and an adaptation manager (656).

As shown in detail in FIG. 6, a compressed code stream is received by the computer (610). The director (652) supports and enables pre-processing of the code stream (630). Specifically, in one embodiment the director (652) creates a metadata representation (642) of the code stream, also referred to as a phrase array, and in one embodiment, also creates a bit array. The metadata representation (642) is stored in data storage (640). The metadata maps tokens in the compressed code stream to a phrase or a byte, e.g. an identified phrase and a literal. An example metadata representation (642) is shown with three entries (644), (646), and (648). Entries (644) and (646) each includes two values (644a) and (644b) associated with the first entry (644), and values (646a) and (646b) associated with the second entry (646). Values (644a) and (646a) are each in the form of a pointer to a location of a phrase within the representation (642). Similarly, values (644b) and (646b) are each in the form of a length of the phrase associated with the respective pointer. Entry (648) pertains to a literal reference by an entry, and its associated values, in the metadata representation (642). The identified phrase references the literal, with the literal being un-compressed data within the stream of data (630), also referred to as a code stream. Accordingly, the phrase array includes one or more literals or phrases referencing the literals. In another embodiment, the director (652) builds the phrase array at the beginning of the decompression for the requested data, and the metadata representation is not stored in data storage (640).

The decode manager (654) functions to support decoding of the phrase array from any position therein. Specifically, decoding the requested data does not require decoding the code stream in its entirety, nor does it require decoding of the encoded code stream from a specific position within the code stream, such as the start or end position. Rather, based on the structure of the phrase array and the manner in which it was created by the director, the decode manager (654) may decode the requested data from any starting point within the compressed code stream. The decode manager (654) further supports and enables a recursive extraction of the requested data starting with any identified arbitrary position. In one embodiment, the decode manager (654) identifies a phrase within the phrase array that contains the starting point. Based upon the starting point indicated by the decode manager (654), a literal is identified and extracted. If the starting point is a phrase within the array, a back pointer associated with the phrase provides direction to the literal within the array. The decode manager (654) supports recursive extraction of the pre-processed code stream from an arbitrary starting point within the array to extract the literal. Accordingly, the decode manager (654) functions to decode the code stream as processed by the director (652), with the decoding taking place from any arbitrary initial position within the compressed code stream.

The stream of data (630), also referred to as a code stream, may be a defined length, or in one embodiment, may be a continuous stream of data that continues to grow. The adaptation manager (656) functions to address the compression and representation of the code stream with its growth. More specifically, the adaptation manager (656) dynamically adapts the metadata representation with growth of the uncompressed code steam. In one embodiment, the code stream (630) is partitioned, and the adaptation manager (656) functions to support the partitioning with metadata in the representation indicating the partitions within the code stream. With respect to the partitioning, iterative decoding of the compressed data stream by the decode manager (654) may be in the form of a sequential decompression or a partial decompression of one or more successive partitions. The sequential decompression includes all partitions containing the span of data that is the subject of the decoding. The partial decompression includes an ending portion of a first partition in which the phrase is located and a sequential decompression of any remaining partitions that reference an ending address for the requested span of data. Accordingly, data is compressed into a compressed code stream and at a later time, as required, recursively decompressed from an arbitrary position within the compressed code stream through the support of the director (652), decode manager (654), and the adaptation manager (656).

As identified above, the director (652), decode manager (654), and adaptation manager (656), are shown residing in the functional unit (650) of the computer (610). Although in one embodiment, the functional unit (650) and director and managers (652)-(656), respectively, may reside as hardware tools external to the memory (614). In another embodiment, the director and managers (652)-(656), respectively, may be implemented as a combination of hardware and software in the shared pool of resources. Similarly, in one embodiment, the director and managers (652)-(656) may be combined into a single functional item that incorporates the functionality of the separate items. As shown herein, each of the director and manager(s) (652)-(656) are shown local to one computer system (610). However, in one embodiment they may be collectively or individually distributed across a shared pool of configurable computer resources and function as a unit to support data compression and decoding. Accordingly, the director and managers may be implemented as software tools, hardware tools, or a combination of software and hardware tools.

Furthermore, the described features, structures, or characteristics may be combined in any suitable manner in one or more embodiments. Examples of the director and managers have been provided to lend a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

The functional unit(s) described above in FIG. 6 has been labeled with a director and managers. The director and managers may be implemented in programmable hardware devices such as field programmable gate arrays, programmable array logic, programmable logic devices, or the like. The director and manager(s) may also be implemented in software for processing by various types of processors. An identified director or manager of executable code may, for instance, comprise one or more physical or logical blocks of computer instructions which may, for instance, be organized as an object, procedure, function, or other construct. Nevertheless, the executable of an identified director or manager need not be physically located together, but may comprise disparate instructions stored in different locations which, when joined logically together, comprise the managers and achieve the stated purpose of the director and managers.

Indeed, a director or manager of executable code could be a single instruction, or many instructions, and may even be distributed over several different code segments, among different applications, and across several memory devices. Similarly, operational data may be identified and illustrated herein within the director or manager, and may be embodied in any suitable form and organized within any suitable type of data structure. The operational data may be collected as a single data set, or may be distributed over different locations including over different storage devices, and may exist, at least partially, as electronic signals on a system or network.

Figure 7:
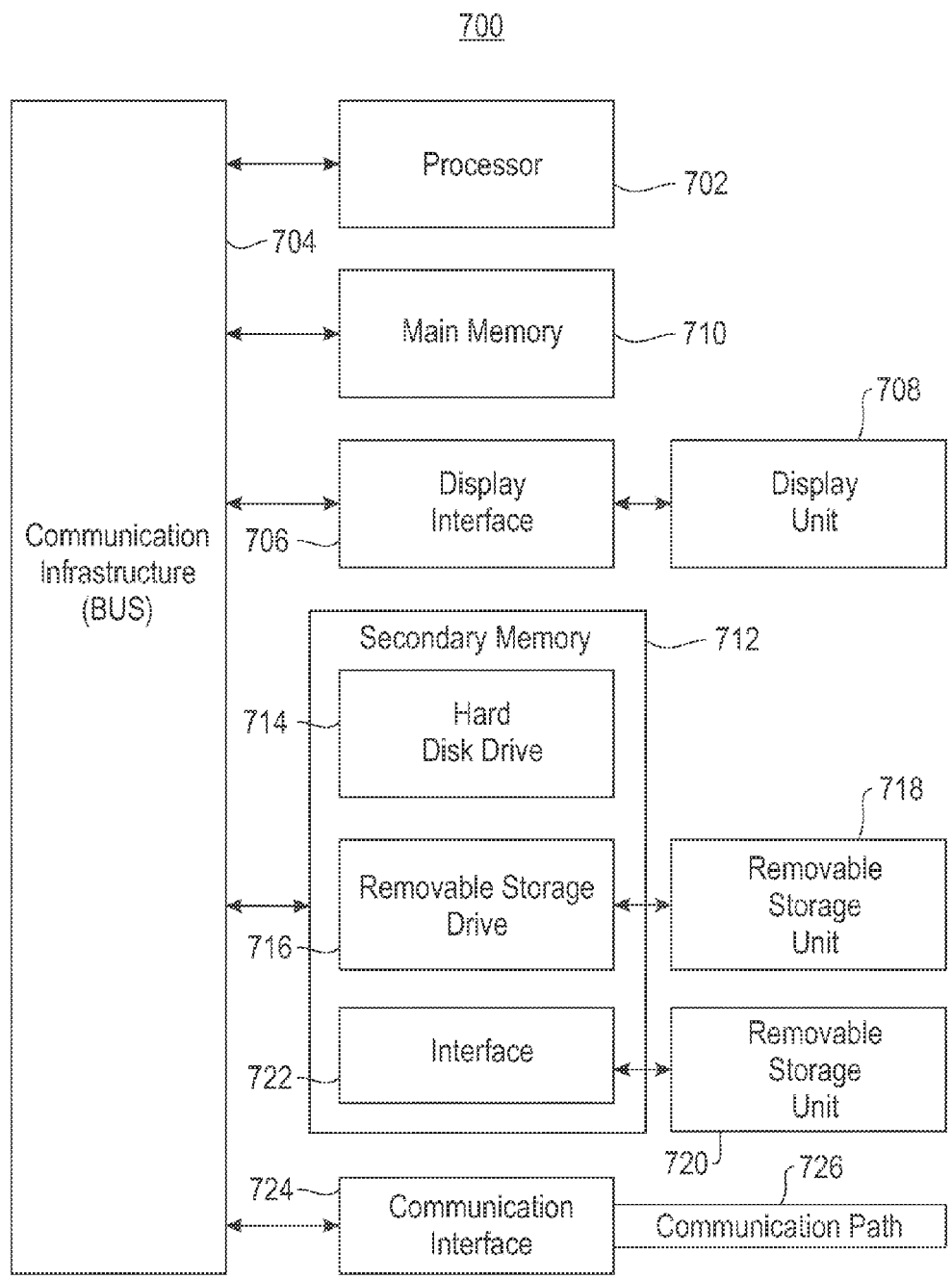
FIG. 7 depicts a block diagram of a computing environment according to an embodiment of the present invention.

Referring now to the block diagram of FIG. 7, additional details are now described with respect to implementing an embodiment of the present invention. The computer system includes one or more processors, such as a processor (702). The processor (702) is connected to a communication infrastructure (704) (e.g., a communications bus, cross-over bar, or network).

The computer system can include a display interface (706) that forwards graphics, text, and other data from the communication infrastructure (704) (or from a frame buffer not shown) for display on a display unit (708). The computer system also includes a main memory (710), preferably random access memory (RAM), and may also include a secondary memory (712). The secondary memory (712) may include, for example, a hard disk drive (714) and/or a removable storage drive (716), representing, for example, a floppy disk drive, a magnetic tape drive, or an optical disk drive. The removable storage drive (716) reads from and/or writes to a removable storage unit (718) in a manner well known to those having ordinary skill in the art. Removable storage unit (718) represents, for example, a floppy disk, a compact disc, a magnetic tape, or an optical disk, etc., which is read by and written to by removable storage drive (716). As will be appreciated, the removable storage unit (718) includes a computer readable medium having stored therein computer software and/or data.

In alternative embodiments, the secondary memory (712) may include other similar means for allowing computer programs or other instructions to be loaded into the computer system. Such means may include, for example, a removable storage unit (720) and an interface (722). Examples of such means may include a program package and package interface (such as that found in video game devices), a removable memory chip (such as an EPROM, or PROM) and associated socket, and other removable storage units (720) and interfaces (722) which allow software and data to be transferred from the removable storage unit (720) to the computer system.

The computer system may also include a communications interface (724). Communications interface (724) allows software and data to be transferred between the computer system and external devices. Examples of communications interface (724) may include a modem, a network interface (such as an Ethernet card), a communications port, or a PCMCIA slot and card, etc. Software and data transferred via communications interface (724) is in the form of signals which may be, for example, electronic, electromagnetic, optical, or other signals capable of being received by communications interface (724). These signals are provided to communications interface (724) via a communications path (i.e., channel) (726). This communications path (726) carries signals and may be implemented using wire or cable, fiber optics, a phone line, a cellular phone link, a radio frequency (RF) link, and/or other communication channels.

In this document, the terms "computer program medium," "computer usable medium," and "computer readable medium" are used to generally refer to media such as main memory (710) and secondary memory (712), removable storage drive (716), and a hard disk installed in hard disk drive (714).

Computer programs (also called computer control logic) are stored in main memory (710) and/or secondary memory (712). Computer programs may also be received via a communication interface (724). Such computer programs, when run, enable the computer system to perform the features of the present invention as discussed herein. In particular, the computer programs, when run, enable the processor (702) to perform the features of the computer system. Accordingly, such computer programs represent controllers of the computer system.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, the code stream compression supports flexibility with respect to decompression, including, decompression of the code stream from an arbitrary position therein, with the decompression being a recursive process to the underlying literal of a referenced phrase.

ALTERNATIVE EMBODIMENT

It will be appreciated that, although specific embodiments of the invention have been described herein for purposes of illustration, various modifications may be made without departing from the spirit and scope of the invention. Accordingly, the scope of protection of this invention is limited only by the following claims and their equivalents.

We claim:

1. A method comprising:
   creating a phrase array representation of a compressed code stream, the phrase array including at least one literal, the literal being un-compressed data within the code stream;
   decoding the code stream from any byte position within the compressed code stream, including identifying a phrase within the phrase array containing the byte position;
   directing the decoding to the literal within the phrase array; and
   inserting the decoded literal into a decompressed stream.

2. The method of claim 1, further comprising increasing a rate of decompression, including encoding the phrase array into the compressed code stream, and reading the phrase array from the compressed code stream.

3. The method of claim 1, further comprising the identified phrase matching with at least one phrase selected from the group consisting of: a second phrase and a sequence of phrases starting with the second phrase, including the identified phrase having a back pointer directed to a byte within the second phrase within the phrase array.

4. The method of claim 3, wherein the literal is decoded from the second phrase.

5. The method of claim 1, further comprising two values within at least one phrase, a first of the values being a pointer to a location of the phrase within the array and a second of the values being a length of the phrase.

6. The method of claim 1, further comprising creating a bit array supporting mapping of the code stream from a byte domain to a phrase domain, or mapping of the code stream from a phrase domain to a byte domain.

7. The method of claim 1, further comprising dynamically adapting the encoding during growth of an uncompressed code stream.

8. The method of claim 1, further comprising dividing the compressed code stream into at least two partitions, each partition having a separate phrase array.

9. The method of claim 8, further comprising independently decoding each partition, including decoding a first partition with a first phrase array and a second partition with a second phrase array.

10. The method of claim 8, further comprising selecting a relevant partition for extraction, including identifying a partition start address from partition metadata.

11. The method of claim 8, further comprising sequentially decompressing aspects of each partition containing requested raw data.

12. The method of claim 8, further comprising partially decompressing each partition containing requested raw data.

13. A method comprising:
    partitioning an uncompressed code stream into a plurality of compressed code partitions;
    independently pre-processing each partition of the compressed code stream for creating a metadata representation of the code stream, the metadata representation including a literal, the literal being un-compressed data within the code stream;
    iteratively decoding a subset of the partitions relevant to a span of data requested for extraction, including identifying a phrase within the metadata representation containing a starting point;
    directing the decoding to the literal; and
    randomly decompressing a portion of the compressed code stream starting in a first relevant partition, including the decoded literal extracted from the compressed stream.

14. The method of claim 13, wherein the iterative decoding includes sequentially decompressing an entirety of all necessary partitions containing the phrase.

15. The method of claim 14, further comprising decoding a final partition to a final ending address of the requested data.

16. The method of claim 13, wherein the iterative decoding includes partially decompressing an ending portion of the first partition and sequentially decompressing any remaining partitions referencing an ending address of the requested data.

* * * * *